United States Patent
Zhang et al.

(10) Patent No.: US 12,463,011 B2
(45) Date of Patent: Nov. 4, 2025

(54) INDUCTIVELY COUPLED PLASMA SOURCE WITH RADIAL COIL NETWORK

(71) Applicant: Applied Materials, Inc., Santa Clara, CA (US)

(72) Inventors: Yuhui Zhang, Sunnyvale, CA (US); Yang Yang, Cupertino, CA (US); Zhimin Jiang, Santa Clara, CA (US); Kartik Ramaswamy, San Jose, CA (US); Alok Ranjan, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 122 days.

(21) Appl. No.: 18/388,821

(22) Filed: Nov. 11, 2023

(65) Prior Publication Data

US 2025/0157791 A1      May 15, 2025

(51) Int. Cl.
*H01J 37/32* (2006.01)
*H01L 21/3065* (2006.01)

(52) U.S. Cl.
CPC ..... *H01J 37/3211* (2013.01); *H01J 37/32183* (2013.01); *H01L 21/3065* (2013.01); *H01J 2237/3341* (2013.01)

(58) Field of Classification Search
None
See application file for complete search history.

(56) References Cited

U.S. PATENT DOCUMENTS

| | | |
|---|---|---|
| 7,771,562 B2 | 8/2010 | Brcka |
| 8,299,391 B2 | 10/2012 | Todorow et al. |
| 9,218,943 B2 * | 12/2015 | Yamazawa ............ H01J 37/321 |
| 10,283,329 B2 * | 5/2019 | Mishra .............. H01J 37/32972 |
| 10,971,333 B2 * | 4/2021 | Lee ........................ H01J 37/321 |
| 2002/0060523 A1 * | 5/2002 | Bhardwaj ................ H05H 1/46 |
| | | 315/111.21 |

(Continued)

FOREIGN PATENT DOCUMENTS

JP      2013-219146 A      10/2013

OTHER PUBLICATIONS

Zhang, et al., U.S. Appl. No. 18/388,821, filed Nov. 11, 2023, Title: Inductively Coupled Plasma Source with Radial Coil Network.

(Continued)

*Primary Examiner* — Kenneth B Wells
(74) *Attorney, Agent, or Firm* — Moser Taboada

(57) ABSTRACT

An apparatus for generating plasma inductively in a process chamber leverages a radial coil network. In some embodiments, the radial coil network is a planar structure comprising an inner conductor with an open center where at least one RF power source is electrically connected to the inner conductor at a power node, an outer conductor spaced away from and surrounding the inner conductor where at least one ground is electrically connected to the outer conductor at a ground node, a plurality of branch conductors extending from the inner conductor to the outer conductor where the plurality of branch conductors is distributed uniformly in the radial coil network, and a plurality of capacitors where at least one capacitor of the plurality of capacitors is electrically interposed into each branch conductor of the plurality of branch conductors.

20 Claims, 8 Drawing Sheets

(56) References Cited

U.S. PATENT DOCUMENTS

| | | |
|---|---|---|
| 2004/0124779 A1 | 7/2004 | Howald et al. |
| 2004/0149387 A1 | 8/2004 | Kim et al. |
| 2004/0255864 A1 | 12/2004 | Jeon et al. |
| 2004/0261718 A1 | 12/2004 | Kim et al. |
| 2010/0025384 A1* | 2/2010 | Todorow ................. H05H 1/46 |
| | | 219/121.54 |
| 2011/0094994 A1 | 4/2011 | Todorow et al. |
| 2012/0073757 A1 | 3/2012 | Yamazawa |
| 2012/0325404 A1 | 12/2012 | Tsunoda et al. |
| 2014/0069584 A1* | 3/2014 | Yang ................. H01J 37/32082 |
| | | 156/345.44 |
| 2014/0232263 A1 | 8/2014 | Nguyen et al. |
| 2015/0097479 A1* | 4/2015 | Knyazik ............. H01J 37/3211 |
| | | 315/34 |

OTHER PUBLICATIONS

PCT International Search Report and Written Opinion for PCT/US2024/054948 dated Feb. 20, 2025.

International Search Report for PCT/US2025/028912, dated Aug. 18, 2025.

\* cited by examiner

INDUCTIVELY COUPLED PLASMA SOURCE WITH RADIAL COIL NETWORK

FIELD

Embodiments of the present principles generally relate to semiconductor processing of semiconductor substrates.

BACKGROUND

Plasma is often used in semiconductor processing for etching and deposition. In some instances, an inductive plasma power source may be used to generate plasma in a process volume of an etching process chamber. The inventors have observed, however, that the inductive plasma power sources often cause variations in the plasma density which causes nonuniformity and other anomalies that reduce the process yield of the process chambers.

Accordingly, the inventors have provided improved inductively coupled plasma sources with radial coil networks that substantially improve uniformity and enhance plasma density, by precisely controlling the plasma density and generating strong resonant currents within the coil networks.

SUMMARY

Apparatus for improving plasma density control in process chambers with inductively coupled plasma sources are provided herein.

In some embodiments, an apparatus for generating plasma inductively in a process chamber may comprise a radial coil network with a planar structure that includes an inner conductor with an open center where at least one RF power source is electrically connected to the inner conductor at a power node, an outer conductor spaced away from and surrounding the inner conductor where at least one ground is electrically connected to the outer conductor at a ground node, a plurality of branch conductors extending from the inner conductor to the outer conductor where the plurality of branch conductors are distributed uniformly in the radial coil network, and a plurality of capacitors where at least one capacitor of the plurality of capacitors are electrically interposed into each branch conductor of the plurality of branch conductors.

In some embodiments, the apparatus may further include an inductive power excitation source positioned directly above the radial coil network, an inductive power excitation source having a circular open-loop structure or a helix structure, at least one of the plurality of capacitors being a vacuum capacitor, at least one of the plurality of capacitors being a variable capacitor, a plurality of capacitors, each having a capacitance value of approximately 100 pF to approximately 800 pF, a phase shift assembly interposed between the at least one RF power source and the radial coil network where the phase shift assembly has a first output with a phase of zero, a second output with a phase of 120 degrees, and a third output with a phase of 240 degrees where the first output is electrically connected to a first power node that is an interconnection point between a first branch conductor and the inner conductor, the second output is electrically connected to a second power node that is an interconnection point between a second branch conductor and the inner conductor, and the third output is electrically connected to a third power node that is an interconnection point between a third branch conductor and the inner conductor, and where the first power node, the second power node, and the third power node have an angular separation of 120 degrees, an inner conductor that has a hexagon or octagon shape, a plurality of branch conductors that has have a nontangential connection at the inner conductor and a nontangential connection at the outer conductor, a first power node that is positioned at a first end of a first branch conductor of the plurality of branch conductors at the inner conductor and a first ground node that is positioned at a second end of the first branch conductor of the plurality of branch conductors at the outer conductor, a second power node that is positioned at a first end of a second branch conductor of the plurality of branch conductors at the inner conductor and a second ground node that is positioned at a second end of the second branch conductor of the plurality of branch conductors at the outer conductor and where the first branch conductor and the second branch conductor are separated by 180 degrees in the radial coil network, a first RF power source with a first frequency of the at least one RF power source that is connected to the first power node and a second RF power source with a second frequency of the at least one RF power source that is connected to the second power node, a first frequency that is different from the second frequency, a variable phase shift assembly interposed between at least one of the at least one RF power source and a plurality of power nodes positioned at each electrical connection of the plurality of branch conductors with the inner conductor, a radial coil network surrounded by a coupled static magnetic field coil that is electrically connected to a DC bias power supply, at least one shunting variable capacitor that is electrically connected between the inner conductor and a ground, and/or a plurality of branch conductors that has 8 branch conductors or more.

In some embodiments, an apparatus for generating plasma inductively in a process chamber may comprise a radial coil network with a planar structure that includes an inner conductor with an open center where a first RF power source is electrically connected to the inner conductor at a first power node and a second RF power source is electrically connected to the inner conductor at a second power node, an outer conductor spaced away from and surrounding the inner conductor where a first ground is electrically connected to the outer conductor at a first ground node opposite the first power node and a second ground is electrically connected to the outer conductor at a second ground node opposite the second power node, a plurality of branch conductors extending from the inner conductor to the outer conductor where the plurality of branch conductors are distributed uniformly in the radial coil network about the inner conductor and where a first branch conductor of the plurality of branch conductors is electrically interposed between the first power node and the first ground node and a second branch conductor of the plurality of branch conductors is electrically interposed between the second power node and the second ground node, and a plurality of capacitors where at least one capacitor of the plurality of capacitors is electrically interposed into each branch conductor of the plurality of branch conductors and where at least one of the at least one capacitor is a variable capacitor.

In some embodiments, the apparatus may further include a first RF power source and a second RF power source that are different in frequency, phase, or amplitude.

In some embodiments, an inductively coupled plasma (ICP) process chamber for treating substrates with plasma may comprise a chamber body with a lid, a process volume, and a substrate support, a first RF power source with a first frequency, a second RF power source with a second frequency, and a radial coil network with a planar structure positioned above the lid of the process chamber that includes an inner conductor with an open center where the first RF power source is electrically connected to the inner conductor at a first power node and the second RF power source is electrically connected to the inner conductor at a second power node, an outer conductor spaced away from and surrounding the inner conductor where a first ground is electrically connected to the outer conductor at a first ground node opposite the first power node and a second ground is electrically connected to the outer conductor at a second ground node opposite the second power node, a plurality of branch conductors extending from the inner conductor to the outer conductor where the plurality of branch conductors are distributed uniformly in the radial coil network about the inner conductor and where a first branch conductor of the plurality of branch conductors is electrically interposed between the first power node and the first ground node and a second branch conductor of the plurality of branch conductors is electrically interposed between the second power node and the second ground node, and a plurality of capacitors where at least one capacitor of the plurality of capacitors is electrically interposed into each branch conductor of the plurality of branch conductors and where at at least one capacitor is a variable capacitor.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
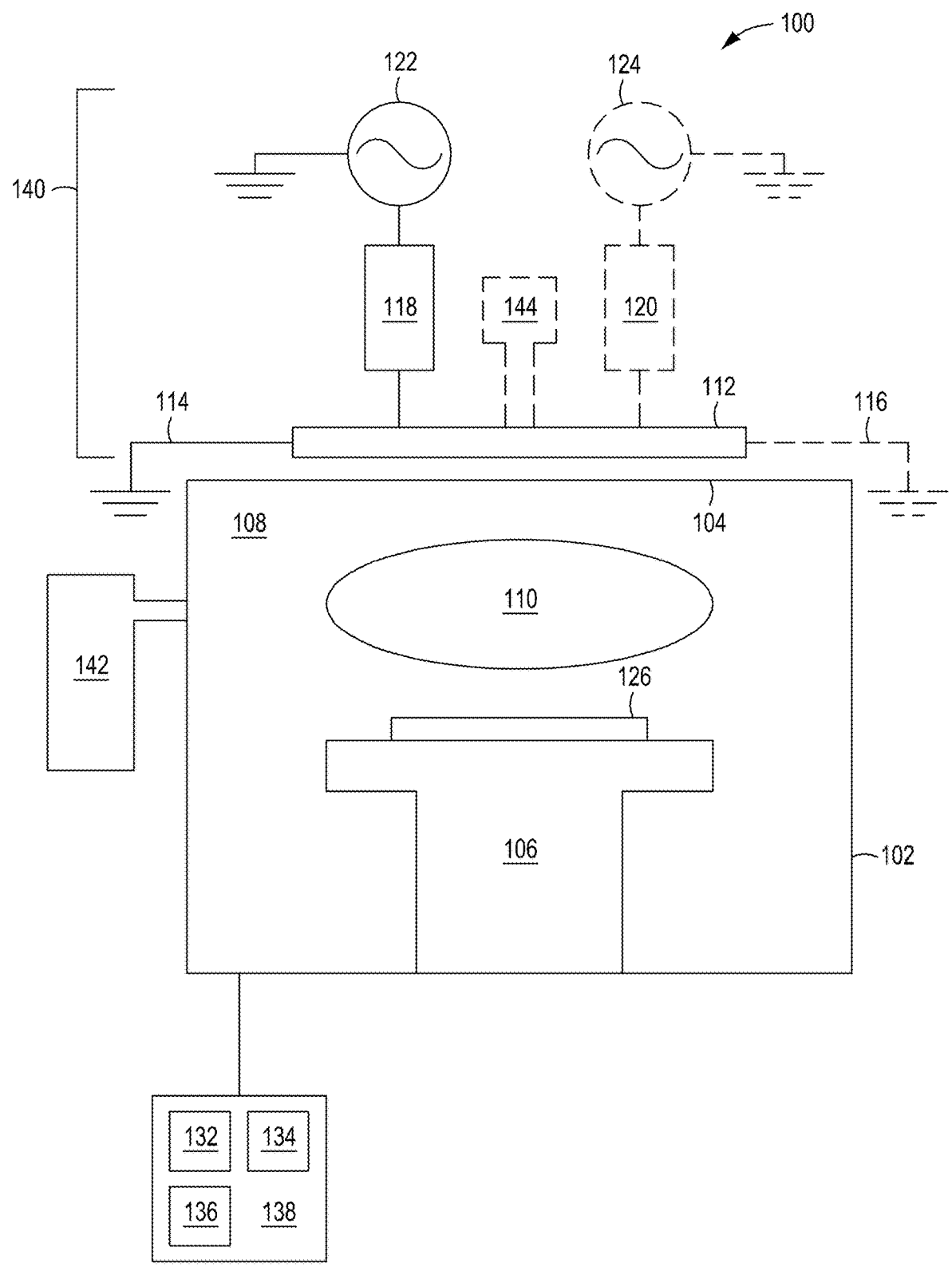
FIG. 1 depicts a cross-sectional view of an inductively coupled plasma (ICP) process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A radio frequency (RF) inductively coupled plasma (ICP) source uses a radial coil network to produce uniform plasma density in a process chamber. The radial coil network helps to induce multiple resonances and generates strong currents and electromagnetic fields when the resonances are reached in the process chamber. The radial coil network also has a larger antenna cross-sectional area to better transfer power into the process chamber. Vacuum capacitors can be used in each branch of the radial coil network to allow additional tuning of the resonance frequencies produced in the process volume. The radial coil network also has the advantage of handling and controlling higher current levels to increase the plasma density levels. Precise skew control of current distribution and plasma uniformity through capacitance and phase tuning further increases the flexibility of the radial coil network. Current flowing through the different branches of the radial coil network can be adjusted independently to enable flexible skew control. In addition, the radial coil network can be excited inductively with various RF power excitation and coupling structures. The use of radial branch conductors in the radial coil network allows precise determination of currents within each branch to accurately control edge profiles and enhance overall uniformity.

Reactive ion etching (RIE) is the most widely adopted plasma etching technique. RIE utilizes directional ion bombardment to enhance the surface etching reaction rate and to realize profile control. An RF ICP source is positioned on top of the reaction chamber. The ICP source generates mass reactive species and controls the plasma density and ion flux. The operation principle of the RF ICP source is to induce an RF current in the reaction chamber by flowing current into an adjacent coil. The coil structure becomes an integral part of the ICP source. However, traditional ICP sources employ helix-based coils that have limited performance and cannot support future semiconductor processing technologies. Thus, future developments in advanced semiconductor manufacturing will require higher performing RIE equipment that is not achievable with conventional ICP sources with helix-based coil structures.

The radial coil network of the present principles provides a planar coil structure with greater performance and control of the plasma in the process chamber to meet the advances that are forthcoming in the semiconductor manufacturing industry. FIG. 1 is an example of an ICP process chamber 100. The embodiments of the present principles may be used with any type of ICP process chamber such as, but not limited to, RIE reactor chambers and the like. The ICP process chamber 100 has a chamber body 102 with a lid 104, a process volume 108, a substrate support 106, and an ICP source 140. The ICP process chamber 100 may also have a gas supply 142 for providing process gases into the process volume 108. In some embodiments, the ICP process chamber 100 may also have a center-fed apparatus 144 that may be, but is not limited to, a center-fed gas supply and/or a center-fed remote plasma source (RPS) and the like.

The substrate support 106 provides a platform for holding a substrate 126 during processing in the process volume 108. Plasma 110 is inductively formed using the ICP source 140 which includes a radial coil network 112 and RF power sources. The radial coil network 112 of the present techniques is a planar coil structure that is positioned directly above the lid 104 of the ICP process chamber 100. In some embodiments, the radial coil network 112 may be connected to a first RF power source 122 via a first match network 118 and grounded via a first ground 114. In some embodiments, a second RF power source 124 may be optional and may be connected to the radial coil network 112 via a second match network 120 and grounded via a second ground 116. Any number of RF power sources and grounds may be implemented with the radial coil network 112.

A controller 138 controls the operation of any of the ICP process chamber aspects as described herein. The controller 138 may use a direct control of the ICP process chamber 100, or alternatively, by controlling the computers (or controllers) associated with the ICP process chamber 100. In operation, the controller 138 enables data collection and feedback from the ICP process chamber 100 and/or ICP source 140 to optimize performance of the ICP process chamber 100 and/or ICP source. The controller 138 generally includes a central processing unit (CPU) 132, a memory 134, and a support circuit 136. The CPU 132 may be any form of a general-purpose computer processor that can be used in an industrial setting. The support circuit 136 is conventionally coupled to the CPU 132 and may comprise a cache, clock circuits, input/output subsystems, power supplies, and the like. Software routines, such as methods and aspects of operation of the apparatus including the radial coil network 112 as described herein may be stored in the memory 134 and, when executed by the CPU 1322, transform the CPU 132 into a specific purpose computer (controller 138). The software routines may also be stored and/or executed by a second controller (not shown) that is located remotely from the ICP process chamber 100.

The memory 134 is in the form of computer-readable storage media that contains instructions, when executed by the CPU 132, to facilitate the operation of the semiconductor processes and ICP source 140 including the radial coil network 112. The instructions in the memory 134 are in the form of a program product such as a program that implements operational aspects of the present principles such as phase shift/skewing control of the radial coil network 112 and the like. The program code may conform to any one of a number of different programming languages. In one example, the disclosure may be implemented as a program product stored on a computer-readable storage media for use with a computer system. The program(s) of the program product define functions of the aspects (including the operation processes and control described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
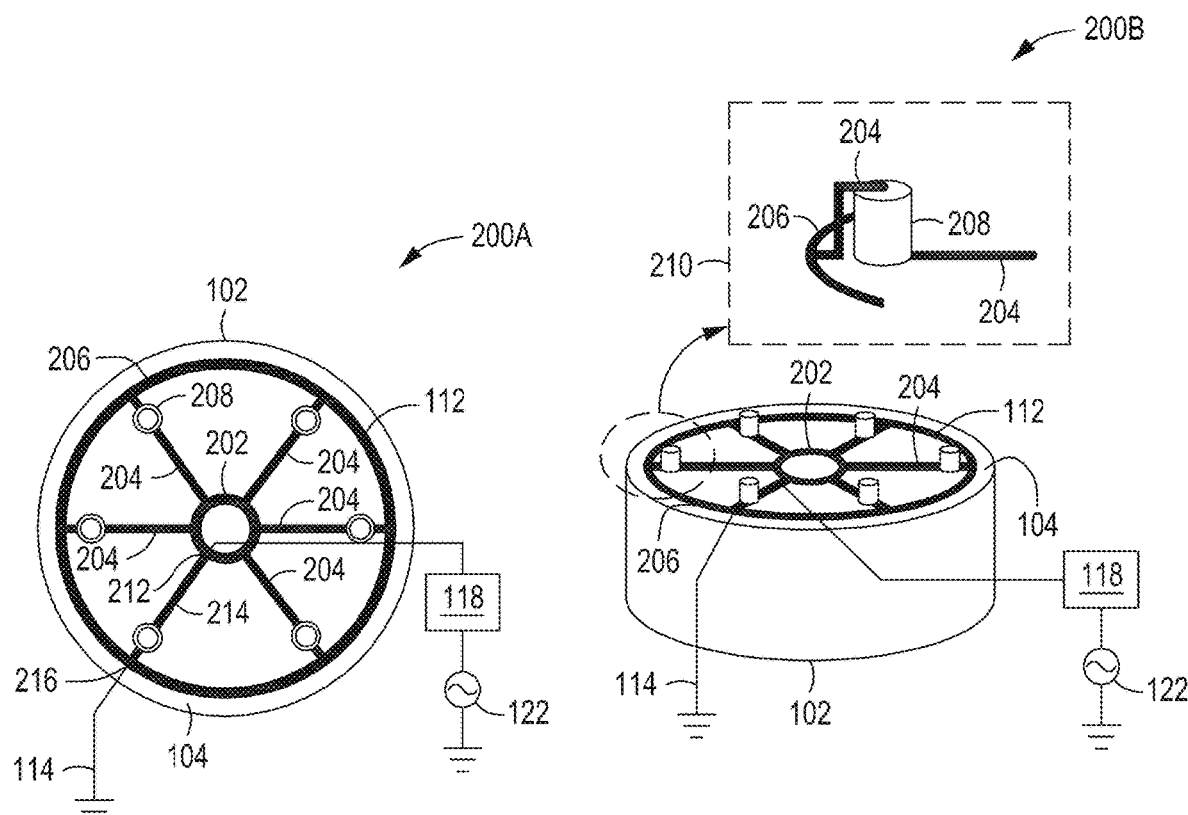
FIG. 2 depicts a top-down view and a cross-sectional view of a radial coil network in accordance with some embodiments of the present principles.

The radial coil network 112 of the present principles has an inner conductor 202 with a ring-like shape that allows for easy installation such as for process chambers with center-fed apparatus 144 such as, but not limited to, remote plasma sources (RPS) and/or center fed gas sources and the like as depicted in a view 200A of FIG. 2. The inner conductor 202 may be circular in shape or have a pentagon, hexagon, or octagon shape and the like (see, e.g., FIG. 11). Other shapes are possible as long as the inner conductor shape permits symmetry of a plurality of radial branch conductors 204. For the sake of brevity, the example radial coil networks herein may be depicted with, but is not limited to, six linear radial branch conductors. More or less radial branch conductors 204 may be used as long as symmetry is maintained within the radial coil network 112 (see, e.g., FIG. 9). The radial branch conductors 204 originate from the inner conductor 202 and terminate at an outer conductor 206. The radial coil network 112 has a planar coil structure. As used herein, a planar coil structure is a coil structure where the inner conductor 202, the outer conductor 206, and the radial branch conductors 204, as a whole, can be intersected with a single plane 1202 as depicted in a view 1200A and a view 1200B of FIG. 12.

Capacitance is added to each of the radial branch conductors 204 using a capacitor 208 electrically interposed in the radial branch conductors 204 as depicted in a view 200B of FIG. 2 and enlarged view 210 of FIG. 2. In subsequent figures, the connection details of the capacitor electrical connections in each of the radial branch conductors 204 may be abbreviated with less connection detail but are electrically connected as indicated in enlarged view 210. In some embodiments, the capacitor 208 may be a vacuum capacitor and the like. In some embodiments, the capacitor 208 may be a variable capacitor to allow for tuning of the radial coil network 112. In some embodiments, the capacitor 208 may have a capacitance value of approximately 100 picofarads (pF) to approximately 800 picofarads (pF). The capacitance value is dependent on the amount of capacitance required to produce a fundamental resonant frequency given an amount of inductance of each of the radial branch conductors 204 (inductance value is impacted by the length of each of the radial branch conductors 204). The inner conductor 202, the outer conductor 206, and the radial branch conductors 204 may be formed of a copper material. The cross-section of the copper material may be rectangular, round, oval, and/or square and the like.

Operationally, the radial coil network 112 is positioned above the lid 104 of the ICP process chamber 100 and generates inductive coupling between the radial coil network 112 and the working gases within the process volume 108 of the chamber body 102. In some embodiments, the first RF power source 122 is connected to a first power node 212 via the first match network 118 at an electrical intersection of the inner conductor 202 and a first radial branch conductor 214. The first ground 114 is connected to the outer conductor 206 at an electrical intersection of the first radial branch conductor 214 and the outer conductor 206 at a first ground node 216. The position of the power node and the ground node influences the current flow through the radial coil network 112. By altering where the power source and ground is connected, the current flow through the radial branch conductors 204 can be adjusted.

Figure 3:
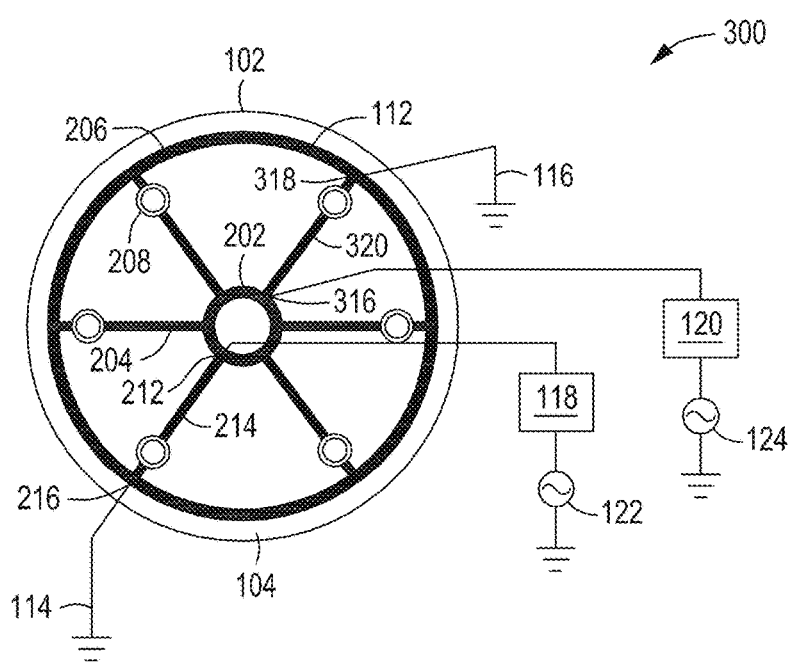
FIG. 3 depicts a top-down view of a radial coil network with dual RF power sources in accordance with some embodiments of the present principles.

In some embodiments, dual RF power sources may be used as depicted in a view 300 of FIG. 3. The first RF power source 122 is connected as described above for FIG. 1. The second RF power source 124 is connected to a second power node 316 via the second match network 120 at an electrical intersection of the inner conductor 202 and a second radial branch conductor 320 (180 degrees from the first RF power source connection). The second ground 116 is connected to the outer conductor 206 at an electrical intersection of the second radial branch conductor 320 and the outer conductor 206 (180 degrees from the first ground connection) at a second ground node 318. The positions of the power nodes and the ground nodes influence the current flow through the radial coil network 112. By altering where the power sources and grounds are attached, the current flow through the radial branch conductors 204 can be adjusted accordingly. The first RF power source 122 and the second RF power source 124 may differ in frequency, phase, and/or amplitude. Example frequencies may include, but are not limited to, 13.56 MHz and/or 60 MHz and the like. In some embodiments, the two power sources are identical in output characteristics to produce a mirror effect of current flow through the radial coil network 112.

The dual RF power source configuration provides better operational flexibility compared to a single RF power source configuration, as the current distribution in different radial branch conductors can be tuned via phase difference, amplitude difference, and/or even driving frequency difference between the two RF power sources. The dual RF power source configuration provides more ways of achieving skew control to improve plasma uniformity. Skew control, as used herein, is in reference to the ability to influence the density of different regions within the plasma to ultimately influence, for example, etching uniformity on surfaces of a substrate and the like by controlling characteristics (e.g., resonance, amplitude, phase, frequency, etc.) of the current flowing through each of the radial branch conductors 204 of the radial coil network 112.

Figure 4:
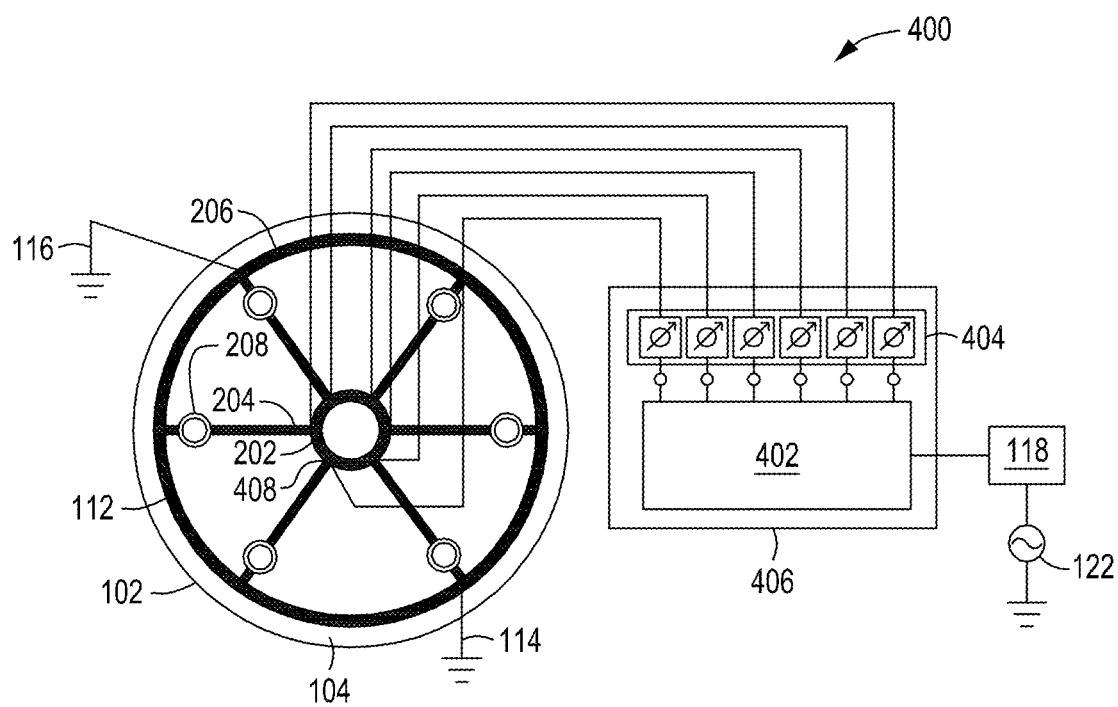
FIG. 4 depicts a top-down view and a cross-sectional view of a multiple phase RF power source for a radial coil network in accordance with some embodiments of the present principles.

In a view 400 of FIG. 4, in some embodiments, a phase shift assembly 406 is interposed between the first match network 118 of the first RF power source 122 and six power nodes corresponding to the intersection points 408 of the six radial branch conductors 204 with the inner conductor 202. In some embodiments, the phase shift assembly 406 includes an FPGA-powered coupler 402 that receives phase setup commands from an operator and generates specific signals to drive all six phase shifters 404. With the phase shift assembly configuration, any combination of RF source conditions can be achieved. Although two grounds (the first ground 114, the second ground 116) are depicted as connected to the outer conductor 206 in FIG. 4, other grounding configurations may be used such as, but not limited to, varying the ground node number and/or changing grounding positions and the like. By altering the number and/or positions of the grounds, the current and voltage distributions in the radial coil network 112 can be further manipulated to achieve enhanced skew control.

Figure 5:
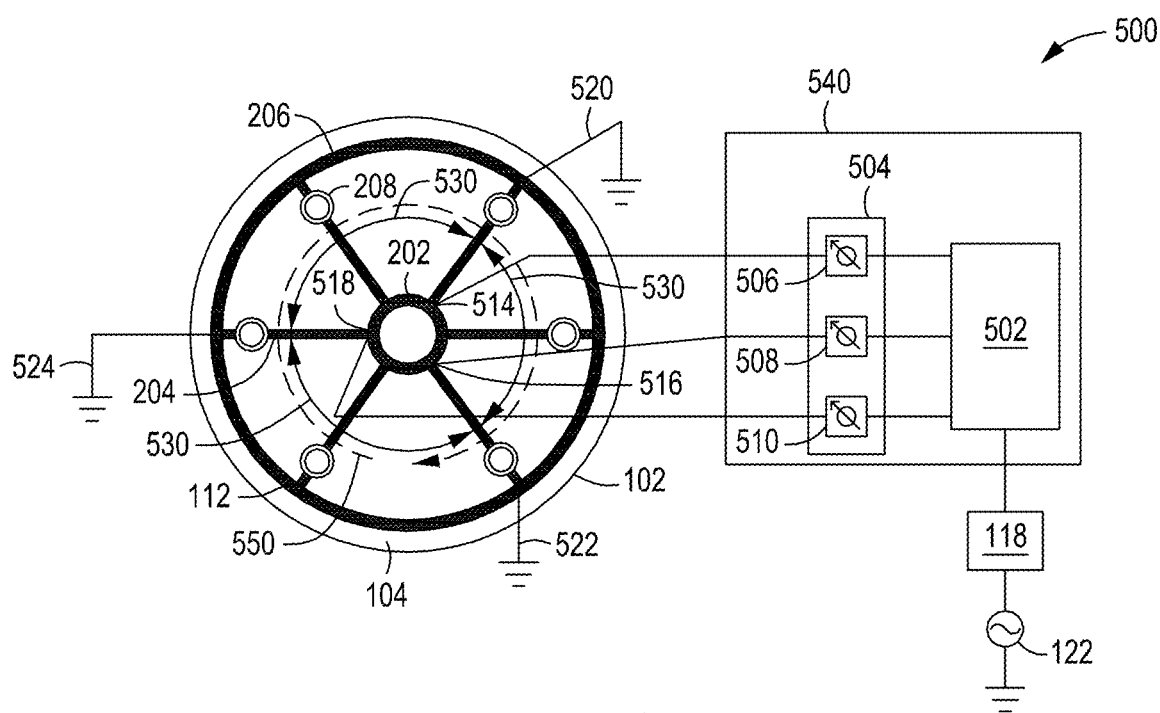
FIG. 5 depicts a top-down view and a cross-sectional view of a three phase RF power source for a radial coil network in accordance with some embodiments of the present principles.

In a view 500 of FIG. 5, in some embodiments, a three-phase operating configuration uses a phase shift assembly 540. In some embodiments, the phase shift assembly 540 includes a power divider 502 and three phase shifters 504. A first phase shifter 506 outputs a signal with zero degrees of phase, a second phase shifter 508 outputs a signal with 120 degrees of phase, and a third phase shifter 510 outputs a signal with 240 degrees of phase. The RF power from the first RF power source 122 is split by the power divider 502 into the three phase shifters 504 and each phase shifter shares the same amount of power. The three phase shifters 504 create output signals with a phase difference of 120° between each two adjacent powered branches. Three power nodes 514, 516, 518 are positioned at three radial branch conductor ends on the inner conductor 202, with 120-degree angular separation 530 between each radial branch conductor of the three power nodes 514, 516, 518. The other end of each radial branch conductor connected to the three power nodes 514, 516, 518 is grounded 520, 522, 524. In the three-phase operating configuration, the maximum and minimum current appear alternately in the radial branch conductors connected to the three power nodes 514, 516, 518, generating a rotating electromagnetic field 550 underneath the radial coil network 112. Since the rotating frequency of the field is the same as that of the first RF power source 122, a uniform plasma can be generated given that the ICP RF power on duration is much longer than that of the RF frequency cycle.

Figure 6:
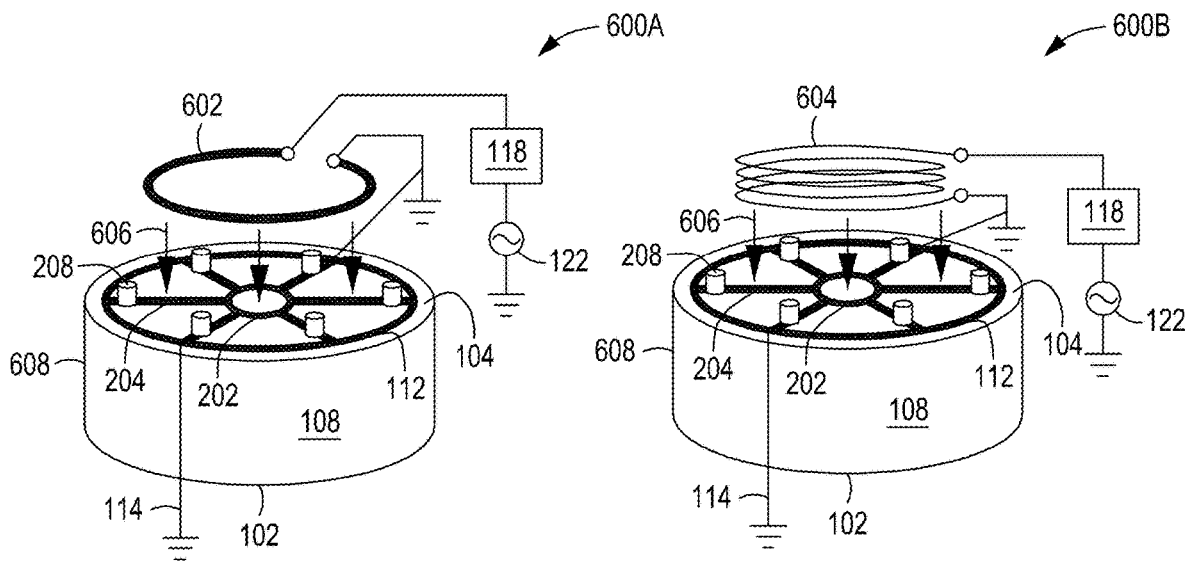
FIG. 6 depicts an isometric view of a radial coil network excited by inductive power excitation sources in accordance with some embodiments of the present principles.

In addition to embodiments using direct coupling between the RF power sources and the radial coil network 112, in some embodiments, indirect coupling configurations can be used. In a view 600A of FIG. 6, an inductive power excitation source 602 with a circular open-loop structure is used to power the radial coil network 112 in connection with the first RF power source 122. The inductive power excitation source 602 is positioned directly above the radial coil network 112 to inductively couple 606 with the radial coil network 112 to excite power within the radial coil network 112. With the inductive power excitation source 602 properly placed, the current in each radial branch conductor 204 can be made substantially equal, and thus, a quasi-uniform plasma can be generated. However, phase control in each of the radial branch conductors 204 is no longer achievable with the excitation configurations of view 600A and view 600B. In a view 600B of FIG. 6, in some embodiments, an inductive power excitation source 604 with a helix structure is used to power the radial coil network 112 in connection with the first RF power source 122. The number of turns and the size of the helix structure can vary from operation to operation and are not limited to those shown in FIG. 6. Part of the electromagnetic field energy generated by the helix structure excites the underlying radial coil network 112, and the remaining portion of the electromagnetic energy penetrates the chamber walls 608 and contributes to the generation of plasma in the process volume 108. Thus, a very high plasma density can be achieved in the reaction chamber. The use of indirect coupling makes driving the radial coil network 112 easier as only a single RF power source is needed to ensure uniformity. Besides, the radial coil network may be excited by the inductive power excitation source without the presence of any ground node in the outer conductor 206, as the current can now be induced directly in the internal loops of the radial coil network.

Figure 7:
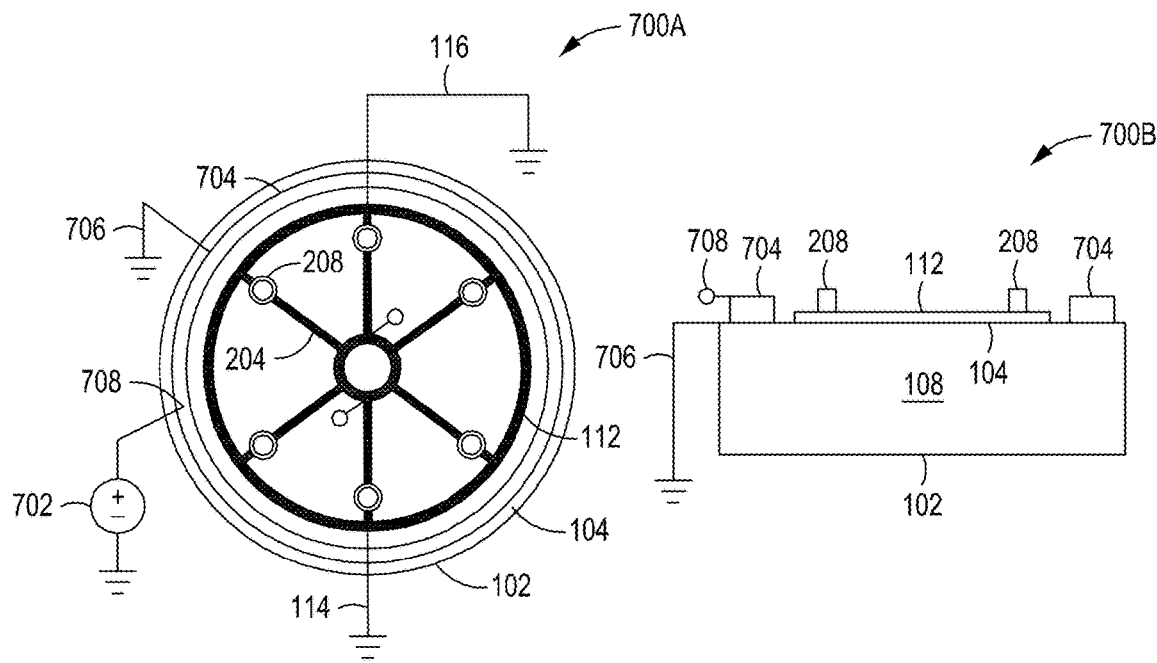
FIG. 7 depicts a top-down view and a cross-sectional view of a radial coil network in conjunction with a static magnetic field coil in accordance with some embodiments of the present principles.

In some embodiments, the radial coil network 112 can be operated in conjunction with a coupled static magnetic field produced by a magnetic field coil 704 as depicted in a top view 700A and a cross-sectional view 700B of FIG. 7. In the top view 700A, the magnetic field coil 704 encircles the radial coil network 112 on the top of the chamber body 102. The magnetic field coil 704 is electrically connected to a DC bias source 702 at connection point 708 and to a ground 706 to generate a static magnetic field. The introduction of a static magnetic field provides additional control of the density and the angular distributions of ions/electrons in the process volume 108 of the ICP process chamber 100.

Figure 8:
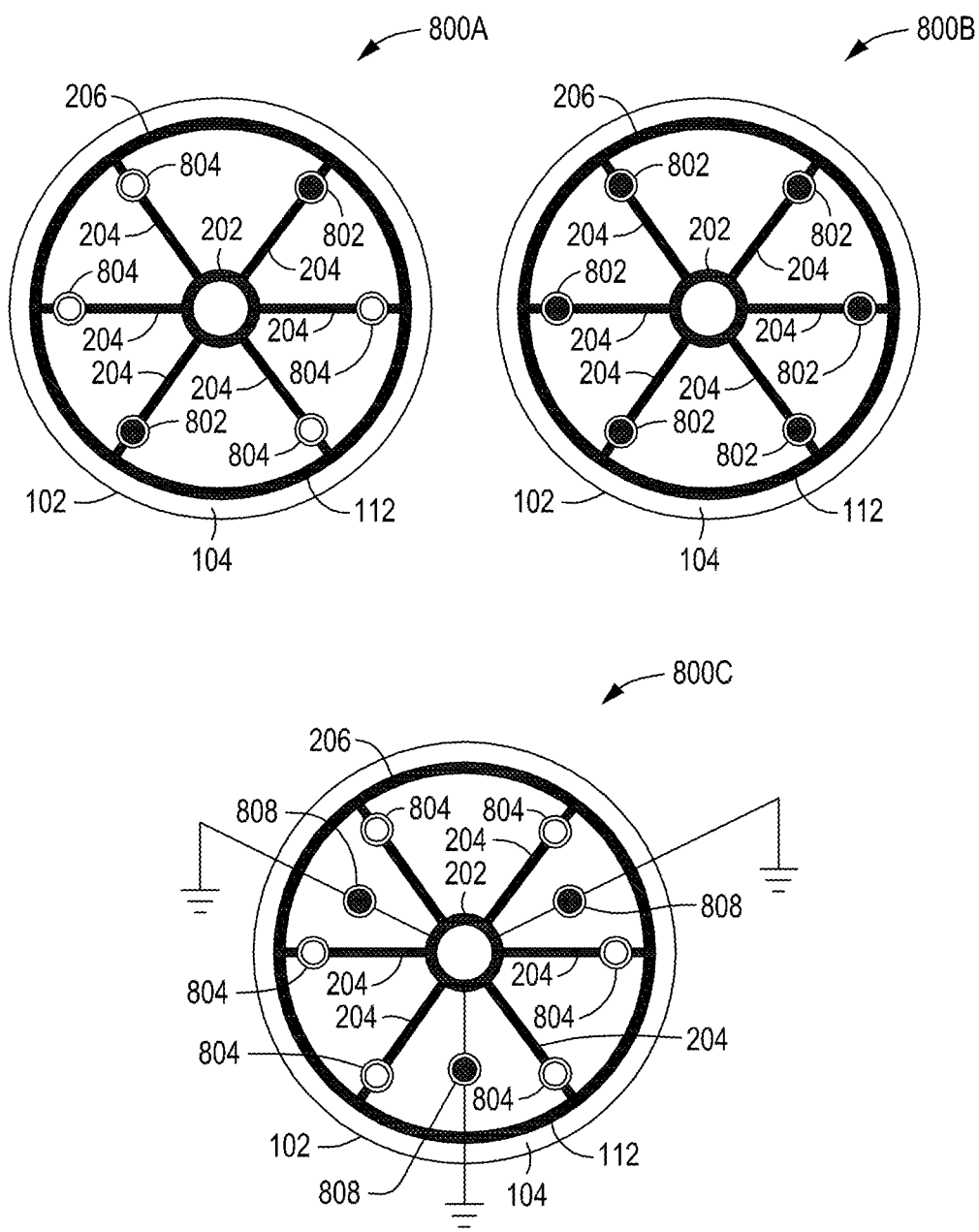
FIG. 8 depicts top-down views of a radial coil network with variable capacitors in accordance with some embodiments of the present principles.

In the above embodiments, the current distribution in the radial coil network 12 can be tuned only by altering RF power sources and grounding conditions. To further improve the system tunability, variable capacitors 802 can be introduced into the radial coil network 112, as illustrated in FIG. 8. In some embodiments, any fixed capacitors 804 can be replaced with variable capacitors 802. Three configurations are depicted in views 800A, 800B, and 800C of FIG. 8. In the view 800A, variable capacitors 802 are placed orthogonally on two of the radial branch conductors 204, and the rest of the radial branch conductors 204 have fixed capacitors 804. The configuration as depicted in view 800A can achieve equal current amplitudes in all radial branch conductors 204 by simultaneously tuning two variable capacitors. That is, the capacitance values of the variable capacitors 802 are equalized and then the capacitance values are tuned until equal current amplitudes are obtained in all radial branch conductors 204. A homogenous plasma is then generated in the process chamber underneath.

In some embodiments as depicted in the view 800B, variable capacitors 802 are used in all radial branch conductors 204 in the radial coil network 112. The configuration further strengthens the skew control of the plasma generation, as the effects of asymmetrical components, such as, but not limited to, unequally sized interconnecting radial branch conductors 204, can now be individually offset by capacitor tuning. In some embodiments as depicted in the view 800C, current tuning can be achieved by grounded shunting variable capacitors 808. In some embodiments, more or less numbers of the shunting variable capacitance branches can be connected to any power node on the radial coil network 112 and embodiments are not limited to solely the configuration presented in the view 800C.

Figure 9:
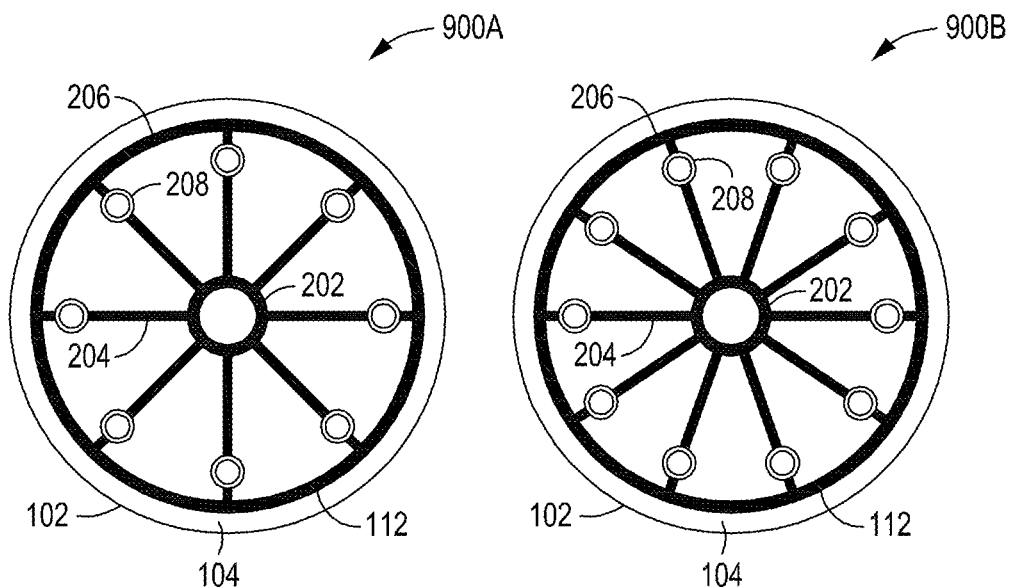
FIG. 9 depicts top-down views of a radial coil network with different numbers of radial branch conductors in accordance with some embodiments of the present principles.

In some embodiments, the number of radial branch conductors 204 can be varied as depicted in, but not limited to, a view 900A and a view 900B of FIG. 9. In the view 900A, 8 shunting branches or radial branch conductors 204 are depicted. In the view 900B, 10 shunting branches or radial branch conductors 204 are depicted. Increasing the number of radial branch conductors 204 strengthens the electromagnetic field underneath the radial coil network 112, thus increasing the generated plasma density. If combined with the all-variable-capacitors configuration depicted in the view 800B of FIG. 8, a more precise skew control of the plasma uniformity can be achieved by increasing the radial branch conductor number.

Figure 10:
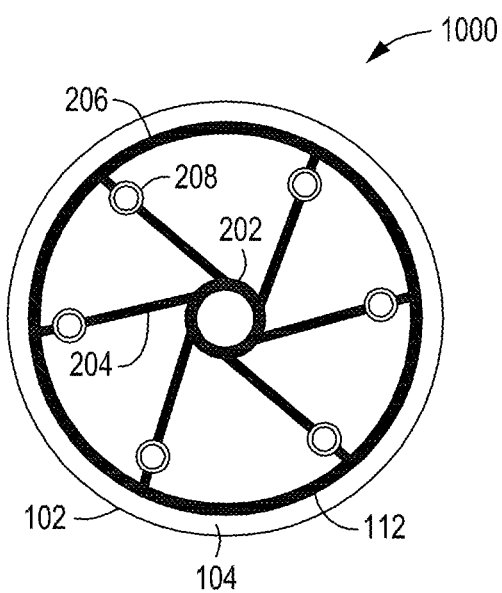
FIG. 10 depicts top-down views of a radial coil network with slanted radial branch conductors in accordance with some embodiments of the present principles.

In some embodiments, "slanted" radial branch conductors can be used as depicted in a view 1000 of FIG. 10. "Slanted" herein is used to indicate that the outward progression of the radial branch conductors 204 is not perpendicular to the tangential line of each contact point or node on the inner conductor 202 and outer conductor 206. From a circuit point of view, no significant differences exist between slanted and straight branch coil networks. However, the increased branch conductor length of the slanted branch network provides a larger effective antenna cross-sectional area, making the indirect coupling of RF power sources using excitation sources (see, e.g., view 600A and view 600B of FIG. 6, etc.) more efficient. Also, the mechanical stability of the radial coil network improves with the slanted branch network as the connection points are more robust. In addition to slanted branches, curved branches and other nonlinear branches (see, e.g., FIG. 11) may be used to increase installation flexibility and/or to circumvent obstacles present on the top of the process chamber.

Figure 11:
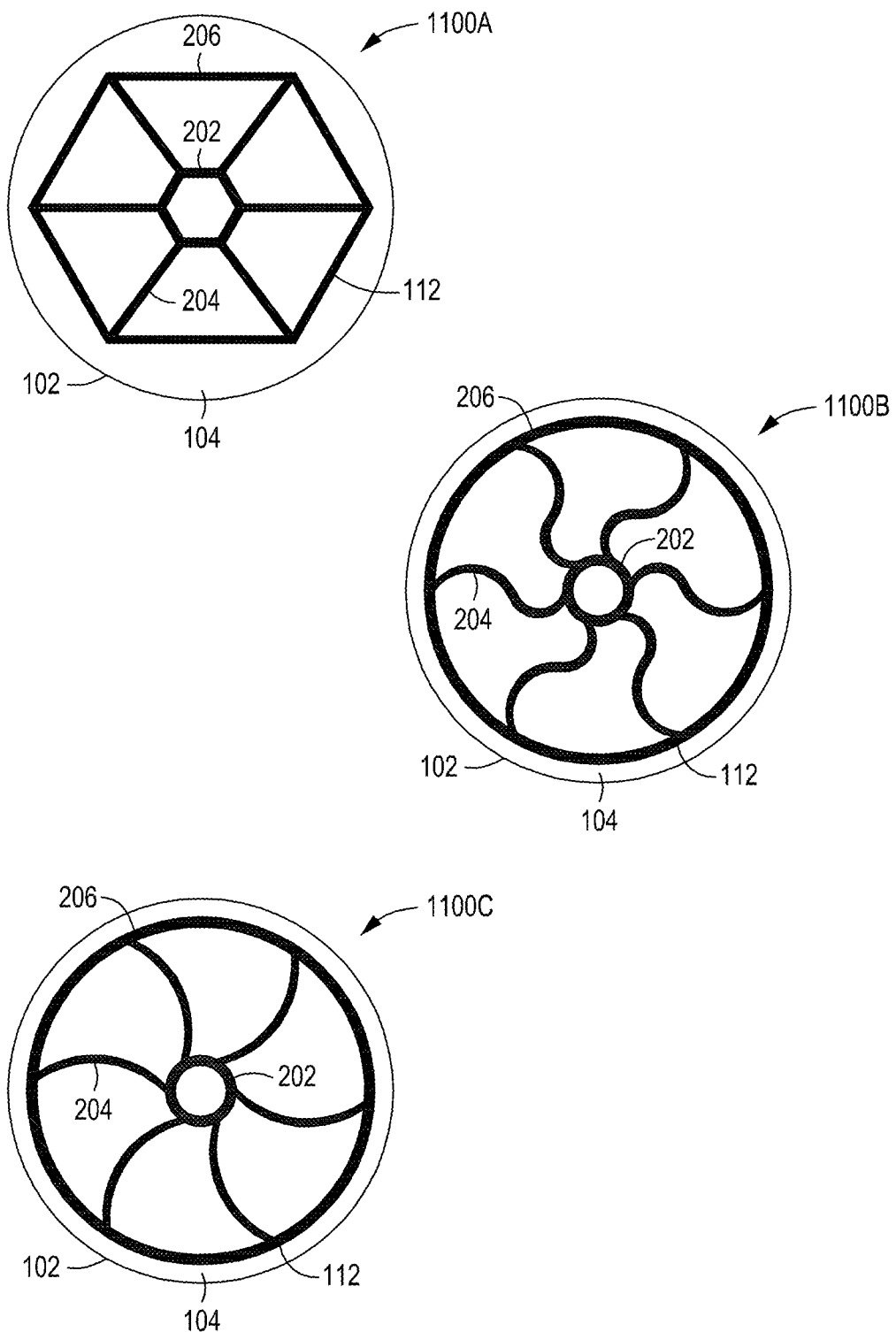
FIG. 11 depicts top-down views of various inner conductor, outer conductor, and radial branch conductor shapes in accordance with some embodiments of the present principles.
Figure 12:
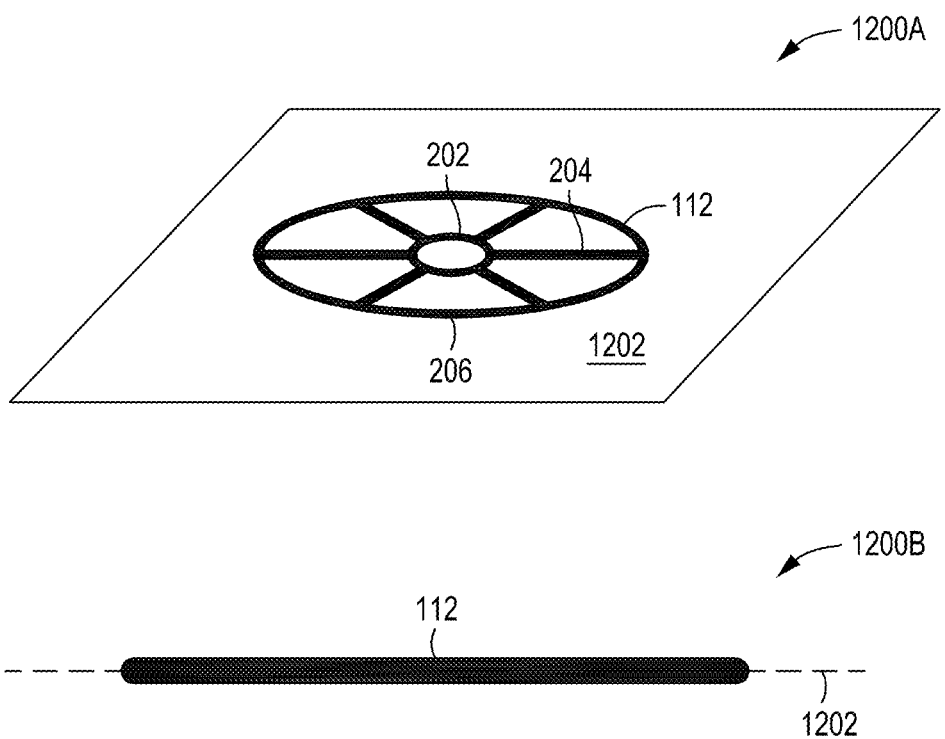
FIG. 12 depicts an isometric view and a cross-sectional view of a radial coil network lying in a single plane in accordance with some embodiments of the present principles.

For the sake of brevity, the above embodiments were discussed separately. However, any combination of aspects from each of the embodiments may be combined to form another embodiment of the radial coil network 112. For example, variable capacitors and/or shunting variable capacitors tied to ground may be used in the embodiments discussed above. Similarly, phase shift assemblies may also be utilized in other embodiments. Multiple RF power sources may also be utilized in various embodiments with identical frequencies and/or with different frequencies and/or with different phases and the like. Varying power amplitudes may be used as well for a single RF power source and/or with multiple RF power sources. Inner conductors and/or outer conductors with varying shapes may be used in the above embodiments as depicted in FIG. 11. In a view 1100A of FIG. 11, the inner conductor 202 and/or the outer conductor 206 may be a pentagon, hexagon, and/or octagon and the like. In a view 1100B of FIG. 11, the radial branch conductors 204 have nonlinear "S" shapes. In a view 1100C of FIG. 11, the radial branch conductors 204 have curved shapes. The nonlinear nature of the radial branch conductors 204 of the view 1100B and the view 1100C allows the length of the radial branch conductors to be increased which thereby increases the effective antenna cross-sectional area. The nonlinear radial branch conductors may also permit easier installation when obstructions are present on top of a process chamber.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for generating plasma inductively in a process chamber, comprising:
   a radial coil network with a planar structure configured to inductively generate plasma in the process chamber, including:
   an inner conductor with an open center, wherein at least one RF power source is electrically connected to the inner conductor at a power node;
   an outer conductor spaced away from and surrounding the inner conductor, wherein at least one ground is electrically connected to the outer conductor at a ground node;
   a plurality of branch conductors extending from the inner conductor to the outer conductor, wherein the plurality of branch conductors are distributed uniformly in the radial coil network; and
   a plurality of capacitors, wherein at least one capacitor of the plurality of capacitors is electrically interposed into each branch conductor of the plurality of branch conductors.

2. The apparatus of claim 1, further comprising:
an inductive power excitation source positioned directly above the radial coil network.

3. The apparatus of claim 2, wherein the inductive power excitation source has a circular open-loop structure or a helix structure.

4. The apparatus of claim 1, wherein at least one of the plurality of capacitors is a vacuum capacitor.

5. The apparatus of claim 1, wherein at least one of the plurality of capacitors is a variable capacitor.

6. The apparatus of claim 1, wherein each of the plurality of capacitors has a capacitance value of approximately 100 pF to approximately 800 pF.

7. The apparatus of claim 1, further comprising:
a phase shift assembly interposed between the at least one RF power source and the radial coil network, wherein the phase shift assembly has a first output with a phase of zero, a second output with a phase of 120 degrees, and a third output with a phase of 240 degrees,
wherein the first output is electrically connected to the power node that is an interconnection point between a first branch conductor and the inner conductor, the second output is electrically connected to a second power node that is an interconnection point between a second branch conductor and the inner conductor, and the third output is electrically connected to a third power node that is an interconnection point between a third branch conductor and the inner conductor, and
wherein the power node, the second power node, and the third power node have an angular separation of 120 degrees.

8. The apparatus of claim 1, wherein the inner conductor has a hexagon or octagon shape.

9. The apparatus of claim 1, wherein each of the plurality of branch conductors has a nontangential connection at the inner conductor and a nontangential connection at the outer conductor.

10. The apparatus of claim 1, wherein the power node is positioned at a first end of a first branch conductor of the plurality of branch conductors at the inner conductor and the ground node is positioned at a second end of the first branch conductor of the plurality of branch conductors at the outer conductor.

11. The apparatus of claim 10, wherein a second power node is positioned at a first end of a second branch conductor of the plurality of branch conductors at the inner conductor and a second ground node is positioned at a second end of the second branch conductor of the plurality of branch conductors at the outer conductor and wherein the first branch conductor and the second branch conductor are separated by 180 degrees in the radial coil network.

12. The apparatus of claim 11, wherein the at least one RF power source includes a first RF power source with a first frequency that is connected to the first power node and a second RF power source with a second frequency that is connected to the second power node.

13. The apparatus of claim 12, wherein the first frequency is different from the second frequency.

14. The apparatus of claim 1, further including:
a variable phase shift assembly interposed between the at least one RF power source and a plurality of power nodes positioned at each electrical connection of the plurality of branch conductors with the inner conductor.

15. The apparatus of claim 1, wherein the radial coil network is surrounded by a static magnetic field coil, wherein the static magnetic field coil is configured to be magnetically coupled to the radial coil network when energized, and wherein the static magnetic field coil is electrically connected to a DC bias power supply.

16. The apparatus of claim 1, further comprising:
at least one shunting variable capacitor that is electrically connected between the inner conductor and a chamber ground.

17. The apparatus of claim 1, wherein the plurality of branch conductors have 8 branch conductors or more.

18. An apparatus for generating plasma inductively in a process chamber, comprising:
a radial coil network with a planar structure configured to inductively generate plasma in the process chamber, including:
an inner conductor with an open center, wherein a first RF power source is electrically connected to the inner conductor at a first power node and a second RF power source is electrically connected to the inner conductor at a second power node;
an outer conductor spaced away from and surrounding the inner conductor, wherein a first ground is electrically connected to the outer conductor at a first ground node opposite the first power node and a second ground is electrically connected to the outer conductor at a second ground node opposite the second power node;
a plurality of branch conductors extending from the inner conductor to the outer conductor, wherein the plurality of branch conductors are distributed uniformly in the radial coil network about the inner conductor and wherein a first branch conductor of the plurality of branch conductors is electrically interposed between the first power node and the first ground node and a second branch conductor of the plurality of branch conductors is electrically interposed between the second power node and the second ground node; and
a plurality of capacitors, wherein at least one capacitor of the plurality of capacitors is electrically interposed into each branch conductor of the plurality of branch conductors and wherein the at least one capacitor is a variable capacitor.

19. The apparatus of claim 18, wherein the first RF power source and the second RF power source are different in frequency, phase, or amplitude.

20. An inductively coupled plasma (ICP) process chamber for treating substrates with plasma, comprising:
a chamber body with a lid, a process volume, and a substrate support;
a first RF power source with a first frequency;
a second RF power source with a second frequency; and
a radial coil network with a planar structure positioned above the lid of the process chamber and configured to inductively generate plasma in the chamber body, including:
an inner conductor with an open center, wherein the first RF power source is electrically connected to the inner conductor at a first power node and the second RF power source is electrically connected to the inner conductor at a second power node;
an outer conductor spaced away from and surrounding the inner conductor, wherein a first ground is electrically connected to the outer conductor at a first ground node opposite the first power node and a second ground is electrically connected to the outer conductor at a second ground node opposite the second power node;

a plurality of branch conductors extending from the inner conductor to the outer conductor, wherein the plurality of branch conductors are distributed uniformly in the radial coil network about the inner conductor and wherein a first branch conductor of the plurality of branch conductors is electrically interposed between the first power node and the first ground node and a second branch conductor of the plurality of branch conductors is electrically interposed between the second power node and the second ground node; and a plurality of capacitors, wherein at least one capacitor of the plurality of capacitors is electrically interposed into each branch conductor of the plurality of branch conductors and wherein the at least one capacitor is a variable capacitor.

* * * * *